United States Patent [19]

Cunningham et al.

[11] Patent Number: 4,977,484
[45] Date of Patent: Dec. 11, 1990

[54] DIMMER RACK

[75] Inventors: David W. Cunningham, Los Angeles; Gregory F. Esakoff, Huntington Beach, both of Calif.

[73] Assignee: Lee Colortran Inc., Burbank, Calif.

[21] Appl. No.: 329,632

[22] Filed: Mar. 28, 1989

[51] Int. Cl.⁵ .............................................. H02B 1/01
[52] U.S. Cl. .................................... 361/429; 361/391; 361/407; 361/428
[58] Field of Search ................... 211/41; 361/334, 361, 361/390, 394, 395, 407, 426, 428, 429

[56] References Cited

U.S. PATENT DOCUMENTS

| | | | |
|---|---|---|---|
| 2,593,975 | 4/1952 | Brown et al. | 361/428 |
| 3,758,828 | 9/1973 | Stefani | 361/334 |
| 4,131,934 | 12/1978 | Becker et al. | 361/395 |

Primary Examiner—Gregory D. Thompson
Attorney, Agent, or Firm—Christie, Parker & Hale

[57] ABSTRACT

A dimmer rack for mounting a plurality of modular units called dimmer modules is disclosed. Each of the modules is used to provide dimming control for each lighting circuit in a lighting system. The rack is a vertical enclosure and utilizes a plurality of modular shelving elements attached to the sides of each file to define individual receptacles for each module. Tabs in the shelving register with grovoes on the external housing of the dimmer modules, whereby precise tongue and groove mounting of each dimmer module is obtained. The rack provides vertical input power and control signal busses which are mounted side by side at the rear of the rack which register with and are engaged by first mating connectors on the rear of each of the dimmer modules at one end therof. A vertical output power bus is provided at the seat of the rack on the side opposite the power and control signal busses which registers with and engages other mating connectors on the rear of the dimmer modules at the end opposite the first connectors. A vertical neutral bus strip is mounted adjacent the output power bus to provide a return wire connection point for each lighting circuit. Where three phase power is supplied to the rack, the dimmer modules are grouped vertically by phase, one below the other. This permits quick and efficient rack to rack bussing.

17 Claims, 9 Drawing Sheets

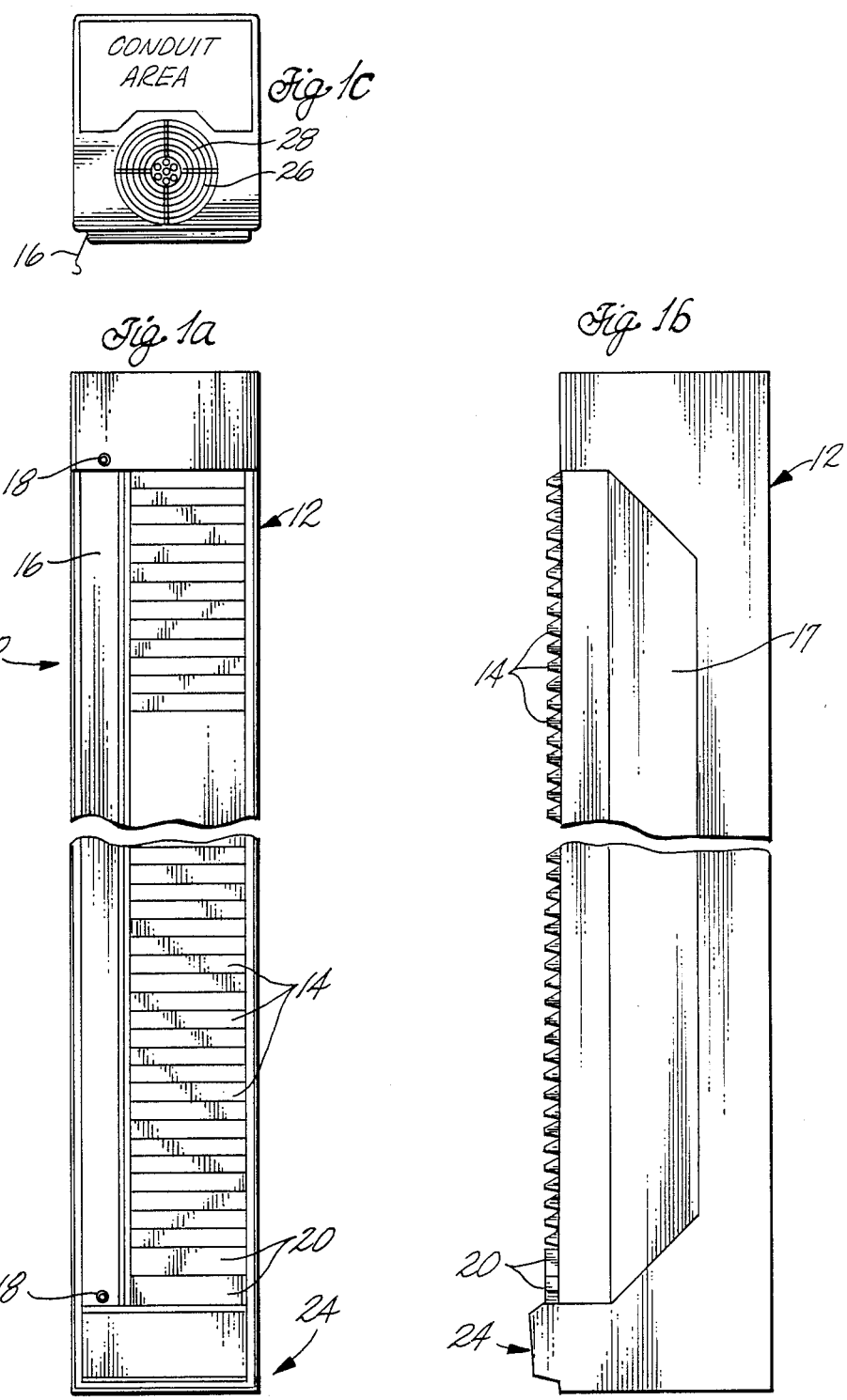

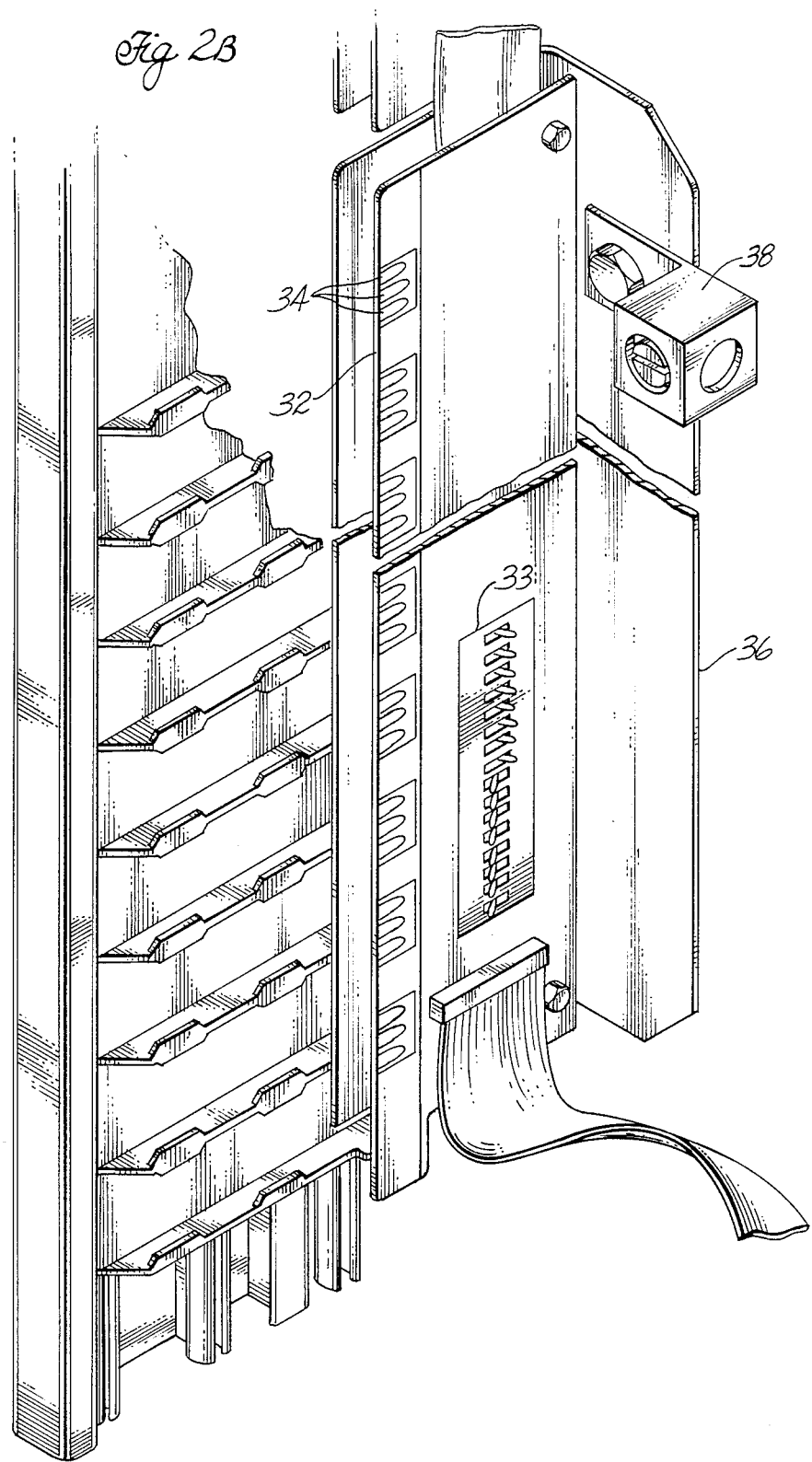

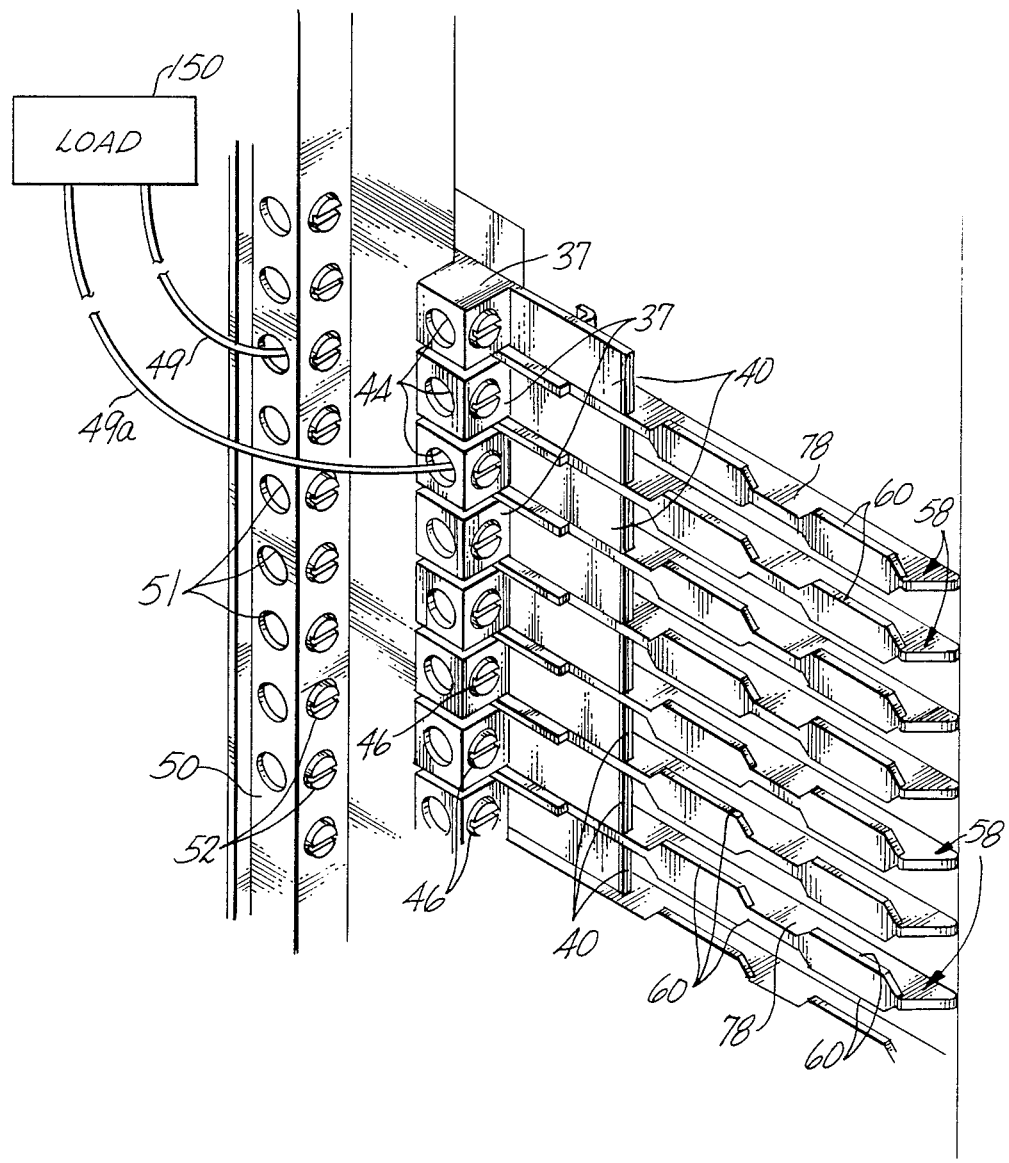

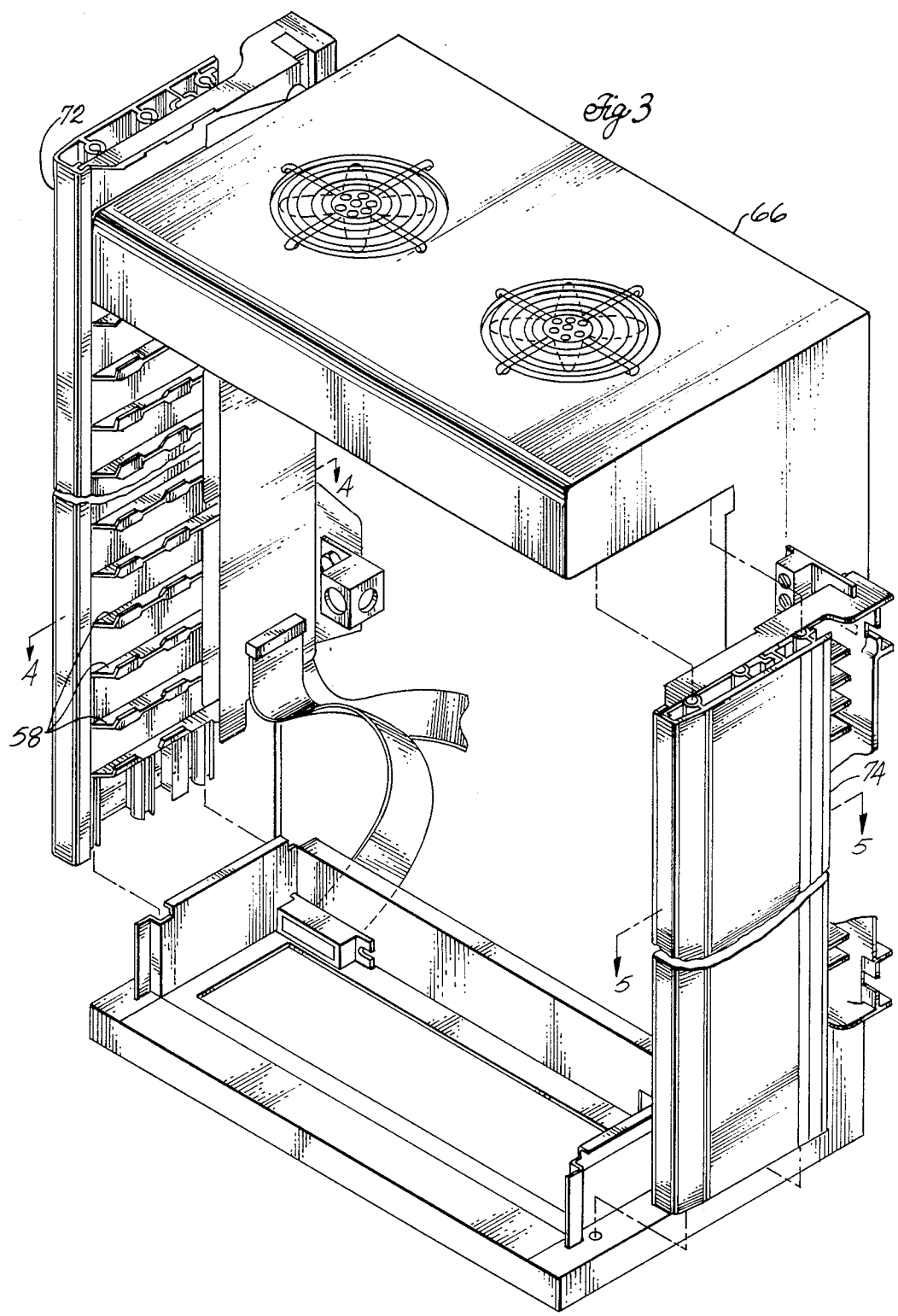

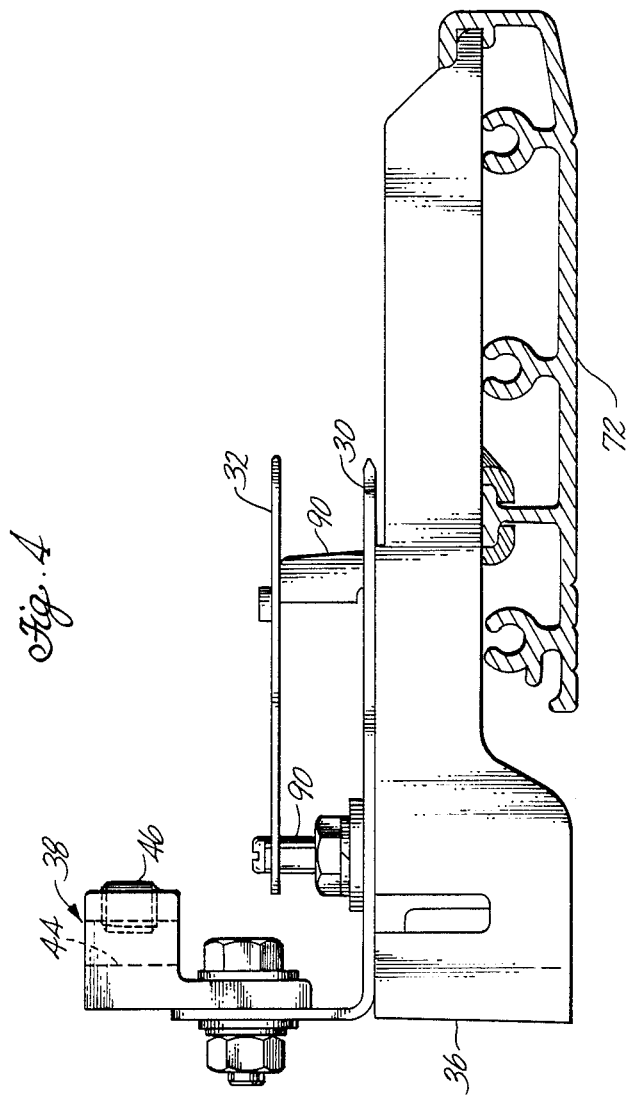

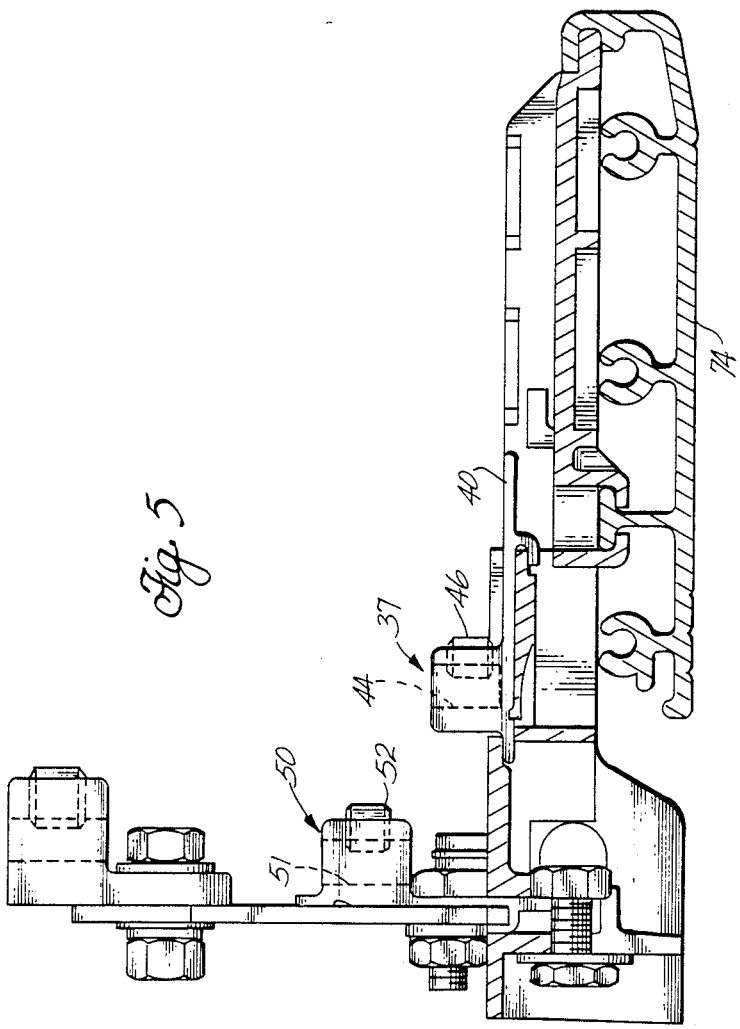

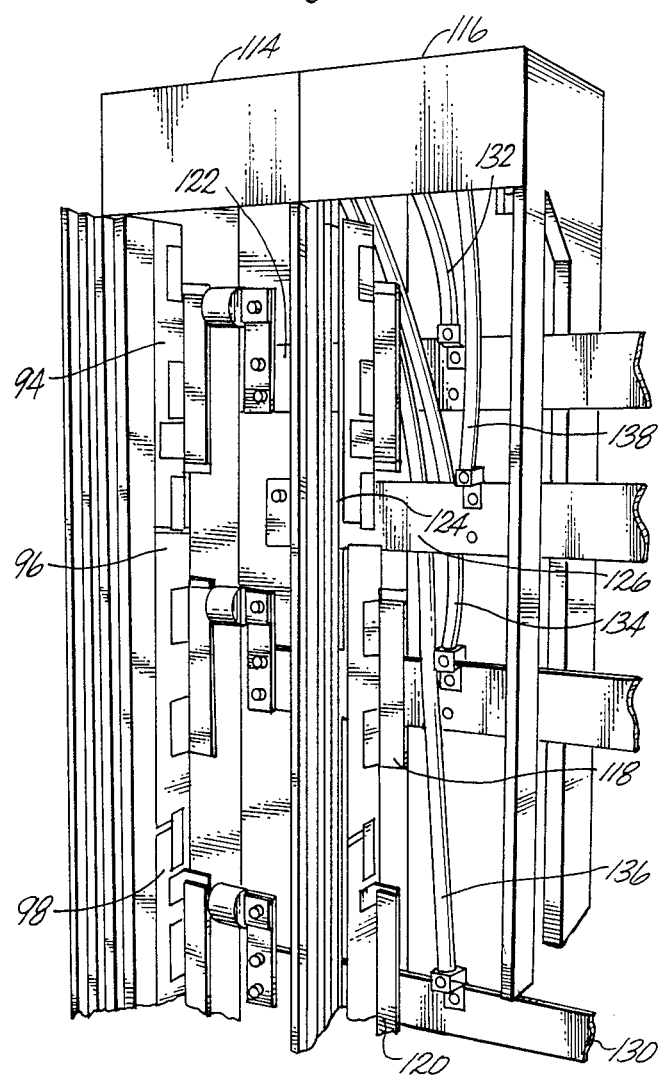

DIMMER RACK

BACKGROUND OF THE INVENTION

The present invention relates to enclosures for mounting electronic equipment and in particular to a uniquely designed housing having a plurality of compartments for mounting dimmer modules which supply electric power to lighting equipment such as incandescent lamps.

The enclosure according to the present invention is frequently referred to as a dimmer rack. Dimming control systems utilizing dimmer racks are already in use in many lighting control applications such as in architectural, theatrical and television settings. Such racks provide the mechanical and electrical means for mounting and electrically connecting a plurality of individual dimmer modules to input power and control signals. Each dimmer module is then used to control the electric power supplied to a specific group or bank of lighting devices such as incandescent lamps. The dimmer module responds to the input and power control signals transmitted to the dimmer modules through the circuitry of the dimmer rack and delivers measured amounts of electrical power through the electrical circuitry of the dimmer rack to the lighting devices to be operated.

In various embodiments of prior art dimmer racks, aluminum shell and chassis systems have been provided which accept predetermined numbers of plug-in dimmer modules from 6 to in excess of 200 and one or more plug-in control modules. Input and output connectors are located on the rear panel of such shell and chassis systems to which the input and control signals are connected and from which output power is delivered to the lighting fixtures to be operated.

Such prior art dimmer racks have certain problems associated with their design and use including the provision of removable shelving and partitions to provide the means for mounting the individual dimmer modules in the dimmer rack. To install or change the wiring connections to the dimmer modules, the user had to perform the attachment and removal of certain mechanical components before the wiring could be accomplished and the rack could be put into service. In many cases, the layout and mechanical design of the rack made this a difficult, inconvenient, and time-consuming task to do.

The physical location of various electrical interconnection points of prior art dimmer racks was also haphazard. Although the input, output and control signal distribution points were usually given due consideration as to positioning and location, the location of the electrically neutral connection point was frequently an afterthought, resulting in its being placed in difficult and inaccessible locations, making for intricate and difficult wiring problems.

Because of the significant power requirements entailed in dimming control systems, it is normal to use three-phase power in supplying electrical power to the lighting load. Prior art dimming systems have typically utilized a rack design wherein the groups of dimmer modules connected to different phases of input power are positioned in a side-by-side configuration. When the lighting load to be driven by the dimming system was extensive and entailed the use of a number of dimmer racks placed side by side, the rack-to-rack electrical bussing was a significant problem. In order to connect one rack to the next, it was necessary to find a suitable location for placing the bus bars. Typically they had to be placed at the rear of or in the base of the dimmer rack. The various phases then were cabled to the bus bars and in some cases cables were also utilized to complete the rack-to-rack electrical communications making the process both difficult and expensive.

Problems in isolating the phases from each other were also encountered.

Dimmer racks, according to the prior art, were also characterized by limited current interrupting capacity. In typical prior art systems, dimmer racks had an upper rating of 10,000 amps. In instances where a higher rating was required, additional fusing in the form of amp traps was provided. Prior art racks were typified by designs wherein the amp traps were mounted in inconvenient and hard-to-service locations.

In dimmer rack design, it has been recognized that provision for a back-up mode of operation for the dimmer control system is desirable. Such a mode of operation entailed the provision of some form of circuitry that would cause certain dimmer modules to receive power and keep certain lighting turned on, even in the event of a failure of the control console or control module electronics. Typically, this was done by providing a limited number of diodes which were hard wired into certain selected dimmer module circuits. The disadvantage of such a design is that it lacked flexibility, only a very specific, very limited number of circuits could be bypassed. There was no ability to pick and choose whether each and every module could be bypassed or not at the option of the user. Hard wiring of the diodes meant that they were usually either inaccessible or difficult to modify or rearrange.

SUMMARY OF THE PRESENT INVENTION

The present invention responds to the needs specified above by providing a dimmer rack that is convenient and easy to set up, service and use. All power and signal distribution hardware is easily accessible. The different power phrases are separated vertically making rack-to-rack busing convenient safe and simple. Panic switches are separated from the control electronics and are easily accessible and reprogrammable. A panic switch is provided for each dimmer module.

The rack design according to the present invention provides a dimmer rack in which all dimmer modules are arranged in one single vertical row, thereby eliminating the need for partitions and other hardware normally provided to space and separate the plurality of side by side rows of modules characteristic of the prior art. In addition, the present invention provides a modular mounting track comprising horizontal shelving which are adapted to receive each module with "tongue and groove" precision. Integrally molded tabs are provided in the shelving which engage slots molded into the exterior surface of the housings of the dimmer modules to precisely position each module on its shelf and guide it into and out of electrical connections with the input, output and control signal distribution buses.

The hardware for distributing power and control signals to and from the dimmer modules is in the form of elongated side by side electrical bus bar type or terminal strip connections located at each side of the rack to provide. On one side, the means for connecting input power and control signals to the dimmer modules are provided. At the other side, an output power connection strip to enable the dimmer modules to be connected to power output terminals is disposed adjacent and parallel to a neutral electrical connection strip whereby wiring of the dimmer rack to the lighting loads and return wiring is greatly simplified and can be quickly accomplished without the removal and reinsertion of partitions and attached hardware.

As noted above, the dimmer rack of the present invention receives and loads the modules in a single vertical stack and the three bus bars for each of the three phases of the electrical input power are likewise vertically spaced apart, one below the other. This permits cross-busing between racks directly from side to side through the side walls of the rack without the need for provision of external bus bars or bus bars located in the base of the rack together with cumbersome cabling to complete the electrical interconnection crossovers or other wiring or bussing arrangements that intersect or pass in close proximity to the hardware for the adjacent phases are also totally eliminated.

In the presently preferred embodiment, the present invention provides a rack for supporting a plurality of dimmer modules which comprises a vertically elongated housing and a plurality of module holders for receiving the plurality of dimmer modules. First electrical termination means are incorporated into a first side of the housing for receiving and distributing control signals, and second electrical termination means are incorporated into said first side of the housing adjacent to the first termination means for receiving and distributing input power to be controlled by the dimmer modules. On the side opposite said first side, third electrical termination means are incorporated into the housing for receiving output power from a dimmer module and transmitting said power to a lighting load located remotely relative to the dimmer rack. The first, second and third termination means are adapted to receive and electrically contact each of the dimmer modules on a plug-in basis.

With a dimmer rack according to the present invention, very substantial improvements over prior art dimmer racks are achieved. The insertion and removal of dimmer modules is quick, precise and accurate, cumbersome positioning and module support hardware is eliminated, as are heavy and expensive connectors designed to withstand with sloppy tolerances which were used on prior art designs. The alignment of the modules in a single vertical file provides an extremely efficient and compact design which reduced space requirements for the dimmer rack substantially. The vertical alignment of modules also enables the separation of power phases thereby enabling straight horizontal rack-to-rack bussing when multiple racks are required. Shelving is injection molded with integral tabs being provided. The tabs engaged mating slots in the exterior housing of the modules to cause the modules to precisely register with and slide into and out of connection with streamlined and sophisticated buses for input and output power, neutral connection and signal distribution. All connection points are conveniently listed and easily accessible. True and complete bypass made operation is achievable by the provision of easily accessible user shutoff power switches for each and every dimmer module.

BRIEF DESCRIPTION OF THE DRAWINGS

These and other features of the invention will be better understood by reference to the drawings wherein:

FIG. 1A is a front elevation view of a dimmer rack according to the present invention.

FIG. 1B is a side elevation view of the rack shown in FIG. 1A.

FIG. 1C is a top plan view of the dimmer rack of FIG. 1A.

FIG. 2B is a detailed view of a portion of the power bus and the signal distribution card.

FIG. 2C is a detailed view of the load connector terminals (fittings) and neutral termination strip.

FIG. 3 is an exploded perspective view of a dimmer rack assembly with dimmer modules remolded according to the present invention.

FIG. 4 is a sectional view taken along lines 4—4 of FIG. 3.

FIG. 5 is a sectional view taken along lines 5—5 of FIG. 3; and

FIG. 6 is a front elevation view showing a cross-bussing interconnection of two or more located dimmer racks according to the present invention located side-by-side;

DETAILED DESCRIPTION OF THE DRAWINGS

Figure 2A:
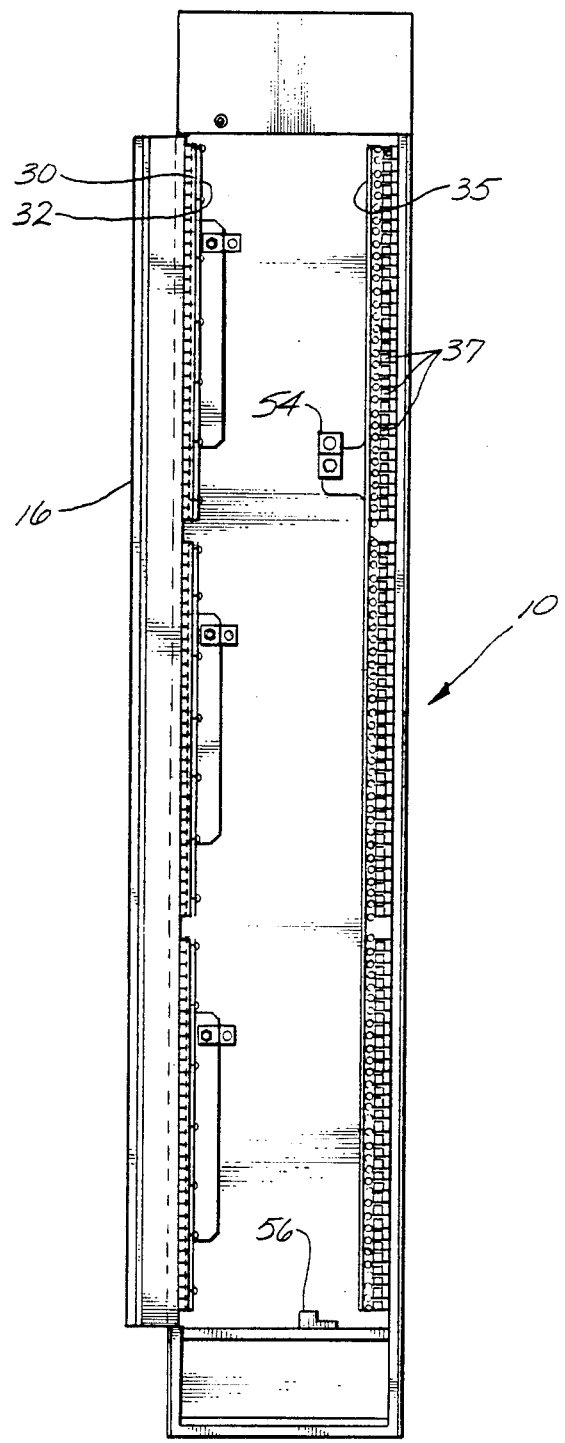
FIG. 2A is a front elevation view of the rack according to the present invention with the front door open and all dimmer modules removed.

A dimmer rack according to the present invention is illustrated in 1A, 1B, and 1C. As shown therein, a dimmer rack 10 comprises a housing 12, a plurality of dimmer modules 14 stacked vertically one on top of the other located within the housing. A door 16 hingedly mounted at the front of the rack partially closes the front opening of the dimmer rack and serves the function of the modules in the rack. It is preferable that the door have a width dimension of 50% or less of the width dimension of the front opening into the rack.

Dimmer racks according to the present invention can be provided in various configurations in the present invention and are characterized by a rack having a single vertical stack containing all modules. Where requirements are that more than the number of dimmer modules contained in a single rack are required, the dimmer rack designed according to the present invention is uniquely arranged to permit horizontal cross-bussing of the various electrical phases and other electrical reference points each rack to a dimmer rack located adjacent to it on either side.

A door lock 18 is provided at the top of the rack and optionally at the bottom of the rack. Located at the bottom of the rack above base area 24 are one or two control modules 20 which contain the electronics for controlling the operation of the dimmer rack and the dimmer modules which are mounted in the rack. In a typical arrangement, an exhaust fan 26 is located at the top of the dimmer rack and is oriented so as to direct the flow of air generated by said fan vertically upward through the dimmer rack. A circular grill 28 is located at the top of the rack exteriorly of the fan. A knockout panel 17 is provided in the side panels of each rack to facilitate rack-to-rack bussing when this is required.

A further illustration of the dimmer rack 10 according to the present invention is shown in FIGS. 2A, 2B and 2C. FIG. 2A is a front elevation view of the rack 10 with the dimmer modules removed and door 16 fully ajar. When facing the rack, a power bus 30 and signal distribution card 32 are located at the left side of the rack. On the right side is a neutral bus 35 and load connector fittings or terminals 37. Lug 56 is secured to the bottom of the dimmer rack cabinet for providing a ground connection.

In FIG. 2B is shown a portion of the interior of a rack according to the present invention. At the left side of the rack, there is positioned in a side-by-side relation a power distribution bus 30 and a signal distribution card 32. The signal distribution card 32 is shown disposed in a vertical orientation with a plurality of conductive areas 34 disposed in groups of three at spaced intervals along the entire length of the card 32. These conductive areas provide the slip fit points of electrical contact with plug-in receptacles on the dimmer modules mounted in the rack. The receptacles engage the bus 30 and car 32 on a plug-in basis as each module is slid into contact with conductive areas 34 and bus 30 when each module is mounted on its respective rack. A bank of panic switches 33 are mounted on card 32 to enable each dimmer module to remain ON or OFF in a bypass mode of operation in the event of a failure of the control console or control module. The power distribution bus 30 and signal distribution card 32 are disposed adjacent to each other and vertically oriented. Bus 30 is a continuous formed conductive element which engages a slot-shaped receptacle at the rear of the dimmer module. An extension 36 is integrally formed with power distribution bus 30 and extends at right angles from bus 30 behind the signal distribution card 32. One or more connector lugs 38 are mounted on extension 36. An input power cable is connected to lug 38 for delivering input power to the rack.

FIG. 2C is a partial perspective view of the side of the dimmer rack opposite bus 30 and card 32. As shown therein, load connector fittings 37 include integrally formed blade-shaped contacts 40. Fittings 37 are mounted on and snap fitted into the module holder. The contacts 40 are spaced from the side wall of the module holder so that the contacts can engage the slot-shaped receptacles at the rear of the dimmer modules which are located at the side of module opposite of the points of contact with the signal distribution card and the power distribution bus. Load connector fittings 37 also comprise receptacles 44 and clamping screws 46. Individual wires leading from the dimmer rack to the incandescent lamps or other loads are inserted into receptacles 44 and secured by clamping screws 46. Each wire extends to the lamp or set of lamps which are driven by each individual dimmer module. A return wire 49 from the lamp load to be driven extends back to and is connected to a neutral connector strip 50 which is mounted adjacent to the load connector fittings 37 and is likewise provided in a receptacle and clamping screw configuration. As shown in FIG. 2C, the neutral connector strip 50 is a continuous rectangular element in which a plurality of receptacles 51 are formed. Clamping screws 52 in threaded receptacles clamp and mold wires inserted in receptacles 51. Strip 50 is connected to the neutral side of the input power by means of lug 54. The individual receptacles 51 are connected by means of cables or wires 49 to the side of the lighting load opposite the connection point from the dimmer modules to provide a return circuit path for the lighting load. For example, one lighting load 150 is shown in FIG. 2C connected to return wire 49 and to an individual wire, i.e., a load connector wire 49a, which is inserted in a respective one of the fittings 37. In this way, electrical connection is made from each module to contact 40 to load 150.

As described in co-pending application Ser. No. 308,809, filed Feb. 9, 1989, dimmer modules are stacked one on top of another in the dimmer rack and are connected to the signal distribution card, the power distribution bus and the load connector fittings by means of slotted receptacles formed in the rear of the dimmer module which are adapted to engage the signal distribution card 32, bus 30 and contacts 40.

Figure 7:
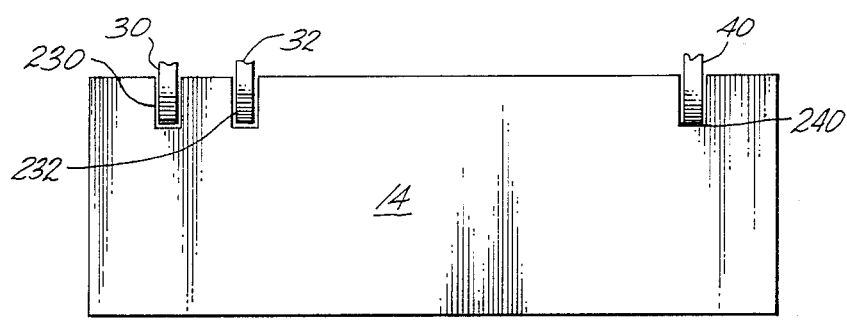
FIG. 7 is an explanatory plan diagram of a dimmer module engaging the power bus, the signal distribution card, and contacts connected to the fittings.

As shown in FIG. 7, which is a diagram looking downward on one module 14 as it would engage the bus 30, card 32, and contacts 40, slotted receptacles 230, 232, and 240 formed in the rear of the module 14 mechanically engage and electrically connect the bus 30, card 32, and contacts 40, respectively, when the module is inserted into its respective shelf in the rack.

A plurality of molded tracks 58 are mounted at each side of the dimmer rack. Each track comprises a shelf element 78 and includes a pair of integrally formed tabs 60 which act as guide elements. The tabs 60 extend upwardly and downwardly from the plane of each track and engage slots formed in the upper and lower surfaces of the dimmer module housing adjacent each end. In this way, the tracks of the dimmer rack guides the dimmer modules in and out of their respective receptacle and into and out of engagement with the electrical connecting hardware provided at the rear of each track.

Figure 8:
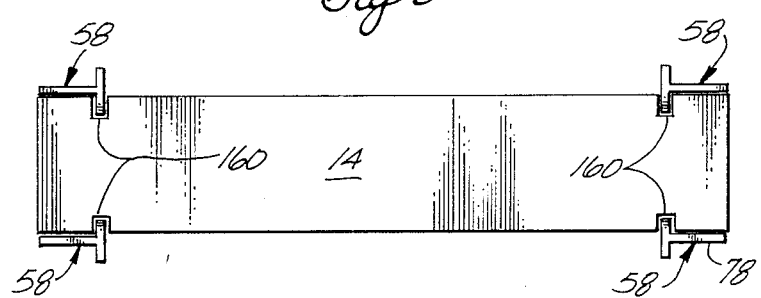
FIG. 8 is an explanatory front elevational view of a dimmer module engaging shelves.

Referring now to FIG. 3, shown therein is an exploded perspective view of a dimmer rack according to the present invention. The rack consists of a rear frame member 66, a first extruded side wall 72 attached to member 66 at one side thereof and a second extruded side wall 74 attached to member 66 at the opposite side thereof. The guide tracks 58 for the dimmer modules are slide-fitted into the interior of side walls 72, 74. For example, as shown in FIG. 8, which is a diagram looking into housing 12 at one module 14 engaging track 58 at the first and second sidewalls 72, 74 of the housing. The tabs 60 extend into the respective slots 160 formed in the upper and lower surfaces of module 14 adjacent each end.

Further details of the signal distribution card 32 and power bus 30 are shown in FIG. 4 which is a sectional view along lines 4—4 of FIG. 3. As shown therein, the signal distribution card 32 is shown disposed in parallel to power distribution bus 30 and spaced away from the power distribution bus by means of insulating spacers 90. Extension 36 from power distribution bus 32 is also shown as is lug 38 which is secured to extension 36 to define the receptacle 44 and in which clamping screw 46 is received.

Referring to FIG. 5, as described above, there is mounted at opposite side of the housing the load connector fittings 37 and neutral terminal strip 50 for completing the electrical circuit to and from the lighting loads to the neutral terminal of the power source. The details of these aspects of the invention are shown in the sectional view of FIG. 5 which is a view taken along lines 5—5 of FIG. 3. One of the contacts 40 of one of the load connector fittings 37 is shown in FIG. 5 as is snap-fitted in place into the track 58. Also shown therein is lug 37 comprising receptacle 44 and clamping screw 46, whereby the contact 40 is connected to a wire leading from the dimmer module to the incandescent lamps or other lighting devices to be driven by the dimmer module. Neutral strip 50 is shown to the rear of lug 37 with the receptacle 51 and clamping screws 52 incorporated into the neutral strip.

A significant feature of the present invention is the ability to conveniently cross bus one dimmer rack to adjacent racks. This is shown in FIG. 6 and, as shown therein, there are two dimmer racks 114, 116. The power bus 94 for phase A is shown at the left side of rack 114 as is power bus 96 for phase B and power bus 98 for phase C. A horizontal bus bar 122 extends from a lug connector on bus 94 through a fusing element such an amp trap (optional) to a connector mounted on phase A power bus 124 on rack 116. A similar horizontal bus bar connection could be made to adjacent racks where three or more racks are required to power the load. The neutral bus bar connection 126 is shown interconnecting the neutral connection point on each rack. Phase B bus bar 128 extends from power bus 96 to the Phase B power bus 118 of rack 116. Similarly, Phase C bus bar 130 extends between racks 114, 116 and interconnects power bus 98 to bus 120 on rack 116.

The interconnection of phases is made horizontally from rack to rack by means of knock-outs or panels removed from the sides of the dimmer rack housing to lugs similarly situated on dimmer racks positioned adjacent to the first dimmer rack. The present design greatly simplifies rack-to-rack interconnection and at the same time eliminates many of the hazards heretofore encountered when making rack-to-rack interconnections.

The inputs to the various horizontal rack connecting busses is accomplished by cable 132 for Phase A, cable 134 for Phase B, wires 136 for Phase C, and wires 138 for the neutral connection of the input power source.

By the present invention, a dimmer rack is provided which contains interlocking positive guides for receiving and interlocking with the dimmer modules along both sides of the dimmer rack. This feature enables the elimination of partitions, support rails and trays which were characteristic of the prior art. A neutral terminal strip is located adjacent the strip incorporating the contacts for receiving output power from the dimmer modules resulting in a configuration in which the output power terminals and neutral terminals are located in parallel and side-by-side relationship at the rear of the rack in easily accessible areas to thereby make wiring from the dimmer rack to the lighting load and the return wiring therefrom convenient and easily accessible.

In the preferred embodiment of the rack according to the present invention, the arrangement of three-phase power is such that Phase A is located at the top of the rack, Phase B in the middle, and Phase C at the bottom. By separating the phases in this manner, rack-to-rack busing is accomplished by simple horizontal bus bars extending from each phase horizontally to an interconnection point of the same phase in racks located adjacent to the rack on either side.

The present invention also provides a user selectible panic switch for each dimmer. The panic switches are located on the signal distribution card in an easily accessible position and are programmed into a "normally on" or "normally off" condition. In the event of failure of the control electronics for the dimmer rack or the control console, the panic switches are preset and the electronics of the dimmer rack are bypassed to transmit power from the power source directly to selected portions of the lighting load to be driven. The rack according to the present invention has a current interrupting capacity that is equal to or in excess of anything currently available. Its circuitry and hardware design is such that the interruption of current, even at very high current levels, can be tolerated without serious damage or destruction of the dimmer rack which is involved.

The rack according to the present invention is also characterized by the ease of accessibility to the individual dimmer modules which are mounted in the rack and the compact design of every aspect of the rack, including the door which is used to hold and lock the dimmer modules in position in the rack. Because the door only covers approximately one-third the width of the dimmer modules or the rack, the present dimmer racks can be located in spaces that heretofore were unusable because of the previous space mandated by the need to be able to open and close a door which is the full width of the rack.

What is claimed is:

1. A rack adapted for supporting a plurality of dimmer modules comprising:

a vertically elongated housing;

a plurality of module holders attached to the housing and adapted for receiving the plurality of dimmer modules stacked in a vertical file;

first electrical termination means incorporated into a first side of the housing for receiving and distributing control signals;

second electrical termination means, incorporated into said first side of the housing adjacent to said first means, for receiving and distributing input power to be controlled by the dimmer modules, and third electrical termination means incorporated into the side of the housing opposite the first side for receiving output power from the dimmer modules and transmitting said power to a lighting load located remotely relative to the dimmer rack, said first, second and third termination means being disposed in relation to the module holders for being electrically contacted by each individual one of the dimmer modules on a plug-in basis.

2. A rack according to claim 1 including a fourth electrical termination means incorporated into said opposite side of the housing at the rear thereof for providing an electrically neutral terminal, said fourth termination means being adapted to receive electrical interconnections for completing the power circuit between the lighting load and the dimmer modules.

3. A rack according to claim 1 wherein the first termination means comprises at least one vertically oriented elongated electrical bus bar and adapted for interconnecting the bus bar and a source of input power.

4. A rack according to claim 2 wherein the first termination means comprises three elongated electrical bus bars arranged in a vertical file, each said bus bar being adapted for interconnection with a different phase of a three phase source of input power.

5. A rack according to claim 2 wherein each module holder comprises:

a shelf and at least one vertically oriented tab extending at a right angle to the shelf, said holder being secured to a side wall of the rack.

6. A rack according to claim 4 wherein the second termination means comprises a vertically oriented signal distribution card, said card having a plurality of contact groups, each group being positioned so as to electrically interconnect to a different one of the individual dimmer modules.

7. A rack according to claim 6 wherein the third termination means comprises a plurality of terminals arranged in a vertical file, each terminal having one or more blade-shaped contacts for interconnecting to output power contacts on each of the individual dimmer modules and means for connecting the terminals to a lighting load to be powered.

8. A rack according to claim 7 wherein each of the plurality of terminals is secured to an individual one of the plurality of module holders in a single vertical file orientation.

9. A rack according to claim 8 wherein the fourth electrical termination means comprises an elongated vertically oriented member disposed in parallel relationship to the vertical file of terminals.

10. A rack according to claim 9 wherein the elongated member comprises a plurality of receptacles and a plurality cooperating clamping screws located at spaced intervals along the elongated member such that each pair of receptacles is aligned with a different one of said module holders.

11. A rack according to claim 10 wherein each of the module holders comprises a shelf and vertically oriented tab means, the shelf being secured to each side wall of the rack, the tab means being oriented so as to register with and adapted to engage cooperating slots formed in a housing for each dimmer module.

12. A rack according to claim 11 wherein each tab means comprises a pair of spaced apart, vertically oriented tabs integrally formed therein, each of said tabs having a portion extending above and another portion extending below the plane of each shelf.

13. A rack according to claim 12 wherein the upwardly extending portion of each pair of tabs engages slots formed in the underside of a dimmer module resting on the shelf and the downwardly extending portion of each pair of tabs engages slots in the topside of a dimmer module resting on the shelf below.

14. A rack according to claim 13 including a plurality of on/off switches mounted in at least one group and secured to the interior of the rack, each of said switches being associated with a different one of said dimmer modules, for electrically bypassing said dimmer modules in the event of an electrical failure in the dimmer rack electronics.

15. A rack according to claim 14 including a door hingedly mounted at the front of the rack on said first side thereof, said door having a width dimension of 50% or less of the width dimension of the front opening into the rack.

16. An assembly device comprising a plurality of racks positioned side by side, each rack being adapted for supporting a plurality of dimmer modules, and each rack comprising:

a vertically elongated housing;

multiple module holders attached to the housing and adapted for receiving a respective plurality of the dimmer modules stacked in a vertical file;

first electrical termination means incorporated into a first side of the housing for receiving and distributing control signals;

second electrical termination means, incorporated into said first side of the housing adjacent to said first means, for receiving and distributing input power to be controlled by the dimmer modules, and third electrical termination means incorporated into the side of the housing opposite the first side for receiving output power from the dimmer modules and transmitting said power to a lighting load located remotely relative to each rack, said first, second and third termination means being disposed in relation to the module holders for being electrically contacted by each one of the respective plurality of dimmer modules on a plug-in basis, wherein the device further comprises means for electrically interconnecting the first termination means of each rack.

17. An assembly according to claim 16 wherein the first termination means comprises three vertically oriented elongated electrical bus bars and means for interconnecting each bus bar with a different phase of a three phase source of input power.

* * * * *

UNITED STATES PATENT AND TRADEMARK OFFICE
CERTIFICATE OF CORRECTION

PATENT NO. : 4,977,484

DATED : December 11, 1990

INVENTOR(S) : David W. Cunningham; Gregory F. Esakoff

It is certified that error appears in the above-identified patent and that said Letters Patent is hereby corrected as shown below:

ON THE TITLE PAGE:

Abstract, line 8, change "grovoes" to -- grooves --.
Abstract, line 12, change "side by side" to
 -- side-by-side --.
Abstract, line 22, change "three phase" to
 -- three-phase --.
Abstract, line 25, change "rack to rack" to
 -- rack-to-rack --.

Column 1, line 66, change "side by side" to
 -- side-by-side --.

Column 2, line 41, change "phrases" to -- phases --.
Column 2, lines 51,63, change "side by side" to
 -- side-by-side -- (both occurrences).

Column 3, line 12, change "side by side" to
 -- side-by-side --.
Column 3, line 46, after "withstand" delete "with".
Column 3, line 61, change "made" to -- mode --.

Column 4, lines 2,4,6,9,11,13,16,18, delete the period and
 insert a semicolon at the end of every line (all
 occurrences).
Column 4, line 20, delete "and".
Column 4, line 47, insert "such" before "that".
Column 4, line 52, insert "of" after "points".

UNITED STATES PATENT AND TRADEMARK OFFICE
CERTIFICATE OF CORRECTION

PATENT NO. : 4,977,484

DATED : December 11, 1990

INVENTOR(S) : David W. Cunningham; Gregory F. Esakoff

It is certified that error appears in the above-identified patent and that said Letters Patent is hereby corrected as shown below:

Column 5, line 45, before "module" insert -- the --.

Column 6, line 56, insert "the" before "opposite".

Column 7, line 12, insert "as" before "an".
Column 7, line 23, change "rack to rack" to
    -- rack-to-rack --.
Column 7, line 57, change "selectible" to -- selectable --.

Column 10, line 10, change "side by side" to
    -- side-by-side --.

Signed and Sealed this

Eleventh Day of August, 1992

Attest:

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO. : 4,977,484
DATED : December 11, 1990
INVENTOR(S) : David W. Cunningham; Gregory F. Esakoff It is certified that error appears in the above-indentified patent and that said Letters Patent is hereby corrected as shown below:

In the Claims:

```
Column 8, line 49, after "claim 1 wherein the" change
         "first" to -- second --.
Column 8, line 53, after "claim 2 wherein the" change
         "first" to -- second --.
Column 8, line 63, after "claim 4 wherein the" change
         "second" to -- first --.
Column 10, lines 42,43, after "claim 16 wherein the" and
         before "termination" change "first" to
         -- second --.
```

Signed and Sealed this

Twenty-fourth Day of May, 1994

Attest:

BRUCE LEHMAN

*Attesting Officer*  *Commissioner of Patents and Trademarks*